(12) United States Patent
Henseler et al.

(10) Patent No.: US 8,791,514 B2
(45) Date of Patent: Jul. 29, 2014

(54) PROVIDING VARIABLE CELL DENSITY AND SIZES IN A RADIATION DETECTOR

(75) Inventors: Debora Henseler, Erlangen (DE); Ronald Grazioso, Knoxville, TN (US); Nan Zhang, Knoxville, TN (US)

(73) Assignees: Siemens Medical Solutions USA, Inc., Malvern, PA (US); Siemens Aktiengesellschaft, Munich (DE)

( * ) Notice: Subject to any disclaimer, the term of this patent is extended or adjusted under 35 U.S.C. 154(b) by 204 days.

(21) Appl. No.: 13/540,079

(22) Filed: Jul. 2, 2012

(65) Prior Publication Data
US 2013/0009267 A1 Jan. 10, 2013

Related U.S. Application Data

(60) Provisional application No. 61/504,725, filed on Jul. 6, 2011.

(51) Int. Cl.
*H01L 27/146* (2006.01)
*G01T 1/24* (2006.01)

(52) U.S. Cl.
CPC .......... *G01T 1/248* (2013.01); *H01L 27/14658* (2013.01)
USPC .................. 257/291; 257/443; 257/E27.133; 257/E27.136

(58) Field of Classification Search
CPC ................. H01L 27/1446; H01L 27/14643; H01L 27/14649; H01L 27/14658; H01L 31/085; H01L 31/09; H01L 31/115
USPC .................. 257/443, 291, E27.133, E27.136; 250/363.03, 363.04
See application file for complete search history.

(56) References Cited

U.S. PATENT DOCUMENTS 8,063,377 B2* 11/2011 Schulz ........................ 250/366
2010/0316184 A1* 12/2010 Iwanczyk et al. .............. 378/19

* cited by examiner

Primary Examiner — Minh-Loan T Tran
(74) Attorney, Agent, or Firm — Peter Kendall

(57) ABSTRACT

An apparatus and method to decrease light saturation in a photosensor array and increase detection efficiency uses a light distribution profile from a scintillator-photodetector geometry to configure the photosensor array to have a non-uniform sensor cell pattern, with varying cell density and/or varying cell size and shape. A solid-state photosensor such as a SiPM sensor having such a non-uniform cell structure realizes improved energy resolution, higher efficiency and increased signal linearity. In addition the non-uniform sensor cell array can have improved timing resolution due to improvements in statistical fluctuations. A particular embodiment for such photosensors is in PET medical imaging.

21 Claims, 4 Drawing Sheets

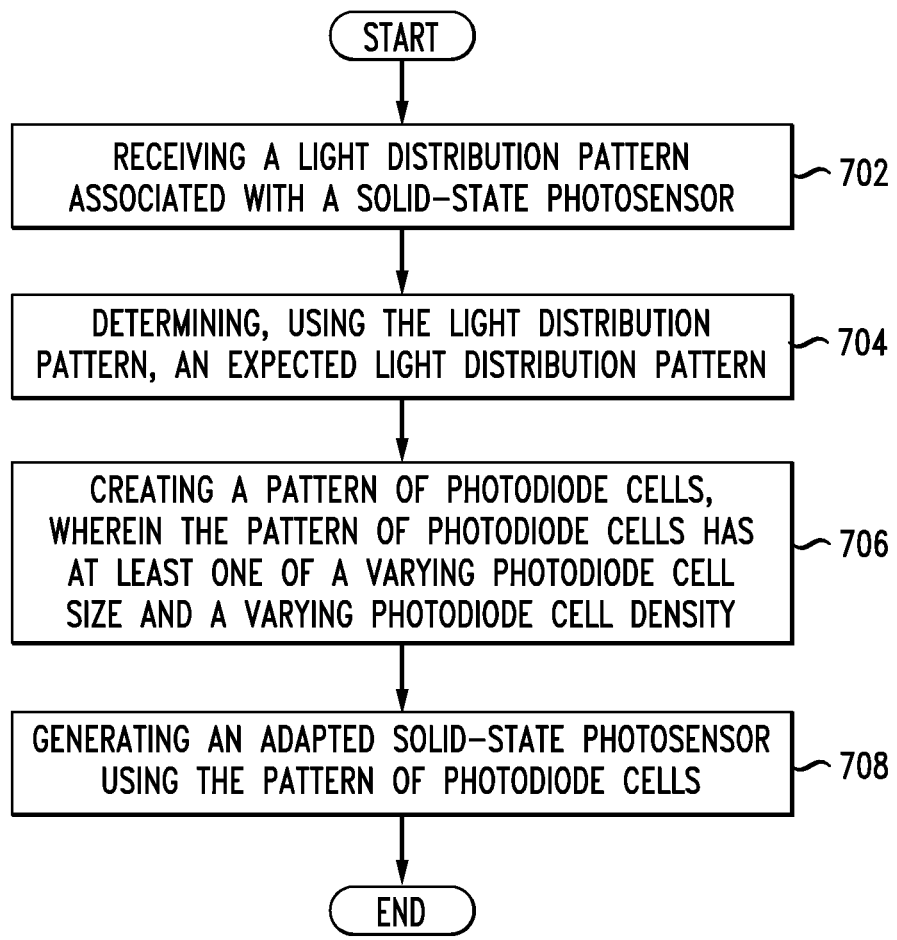

PROVIDING VARIABLE CELL DENSITY AND SIZES IN A RADIATION DETECTOR

CROSS-REFERENCE TO RELATED APPLICATIONS

This application claims the benefit of U.S. Provisional Patent Application 61/504,725, filed on Jul. 6, 2011, the entire disclosure of which is hereby incorporated by reference.

TECHNICAL FIELD

The present invention concerns cell density and size in radiation detectors in such fields as nuclear imaging detectors, e.g., Positron Emission Tomography (PET) or Single Photon Emission Tomography (SPECT).

BACKGROUND

In the field of nuclear medical imaging technology, a subject, e.g. an oncology patient or an animal used in an experiment, can be scanned by detecting radiation emanating from the subject. For example, in a so-called PET scan, a short-lived radioisotope, which decays by emitting a positron, is injected usually into the blood circulation of a living subject. After the metabolically active molecule becomes concentrated in tissues of interest, the research subject or patient is placed in the imaging scanner. The most commonly-used metabolically active molecule for this purpose is 18F-fluorodeoxyglucose (FDG), a sugar, which has a half life of 110 minutes.

As the radioisotope undergoes positron emission decay, it emits a positron, the antimatter counterpart of an electron. After traveling up to a few millimeters, the positron encounters and annihilates with an electron, producing a pair of gamma photons moving in almost opposite directions. These are detected when they reach one of a plurality of scintillation crystals in the scanning device, creating a burst of light detected by an array of photosensors.

Radiation emanating from the subject can be detected in, for example, radiation detector ring assembly 106 illustrated in FIG. 1. At a more granular level, specific radiation events can be detected at detector block 112 comprising an array of radiation sensors, such as plurality of scintillators and associated photosensors $102_n$, such as photomultiplier tubes (PMTs), avalanche photodiodes (APDs), or silicon photo-multipliers (SiPMs). In the case of a PET scan, scintillators can be arranged in a ring 106.

Generally a plurality of sensors, e.g., photosensors 102, can be arranged in a matrix and assigned to detect the light of a scintillator as shown in detector block 112 in FIG. 1. Detector block 112 can be associated with a single scintillation crystal 106 or can be, as shown, a matrix of scintillator crystals that is coupled to the photosensors $102_1 \ldots 102_n$ usually via a light guide. A plurality of detector blocks 112 can be axially arranged adjacent to one another, in a slot, in a line relative to the center of ring 106. To be able to increase the resolution of the system without the high costs of 1:1 coupling, the number of photosensors 102 per block is generally significantly lower than the number of scintillation crystals 106. For example, a detector block may have a plurality of radiation sensors, such as photosensors 102 with, for example, 4, 9 or 16 photosensors 102 arranged in a 2×2, 3×3, or 4×4 matrix behind an array of scintillation crystals 106. Other arrangements with more or fewer photosensors 102 are possible. Thus, scintillation event localization can be determined or interpolated by such a detector block by processing the associated photosensor signals. This can be done by analog filtering, integration, and multiplication of weighted combinations of the photosensor signals or by using digital algorithms that use discrete time sample points of signals obtained directly from the photosensors 102. The PET technique depends on scintillation event detection of the pair of gamma photons.

FIG. 1 illustrates a block diagram of the typical architecture of a detector block 112 and associated analog-to-digital-converters $108\text{-}108_n$ in a conventional system. Each matrix of photosensors 102 produces a plurality of signals that can be processed to generate an image from a plurality of scintillation events that are detected by a photosensor 102. To determine the location of a detected annihilation, the system needs to accurately measure the timing and energy of both detected photons. Consequently a high amount of data has to be produced by the respective measurement circuits.

For example, as shown on the right side of FIG. 1, each scintillator has an associated matrix of detector blocks, such as photosensors $102_1 \ldots 102_n$, which, in this example are PMTs. Each signal of each PMT $102_1 \ldots 102_n$ is first amplified by, for example, associated preamplifiers/buffers $104_1 \ldots 104_n$. The output signal of preamplifier/buffers $104_1 \ldots 104_n$ can then be converted concurrently into discrete-time digital signals by associated analog-to-digital converters (ADC) $108_1 \ldots 108_n$. A sampling clock for each ADC can be provided at terminal 110. In this example, this digital processing architecture uses n independent ADC signals with peripheral circuitry to concurrently sample each of n photosensor signals per block. This can increase the costs of a detector block.

Not all radiation emanating from a subject is detected by scanner 100. Radiation can be emitted outside of the field of view of scanner 100, or radiation can scatter. For example, Compton scatter can occur when a photon collides with an electron, thereby transferring energy to the electron. The collision can cause the photon to deviate from its original path and cause a loss of energy. This collision typically occurs within the subject or in, for example, a scintillation crystal. Due to Compton scattering, events that would otherwise have been detected may be missed. Techniques are known, however, to determine whether a detected gamma photon is a Compton scatter photon and to calculate its original direction to within a certain probability.

The probability that a 511 keV gamma ray be detected is a function of the material composition of the detector block, its size, and its density. For LSO, the probability that the first interaction of the 511 keV gamma ray is a Compton scatter is on the order of 68%, and for short, narrow pixels, the fraction of Compton scatter exiting the pixel can be quite significant.

In addition, the probability of detecting any particular photon from the scintillator depends on the photosensor, for example a SiPM. Each SiPM photosensor pixel consists of a plurality of cells (sometimes also called microcells) which contribute to an overall, summed signal of the photosensor pixel. Each cell is a small avalanche photodiode operating in Geiger mode, above breakdown. When too many photons are captured by a single photosensor pixel, the number of impinging photons can potentially equal or exceed the number of available cells on the photosensor pixel. Because the cells detect a single photon, encountering photons equal to or greater than the number of cells triggers the cells to excess. In this state the photosensor pixel cannot distinguish between one or more of the simultaneously impinging photons, resulting in degradation of signal linearity. In addition, this effect creates additional statistical noise contribution, leading to losses in energy resolution and also in time resolution of the signal.

FIG. 2 illustrates a photosensor pixel 102 comprising a uniform n×n array of photosensor cells; for example, each cell can be 50 μm×50 μm. The photosensor pixel 102 is part of an array of pixels 102-102n, which is coupled, for example, to one or more scintillation crystals 106 to detect light emitted from the crystal(s) due to scintillation events.

FIG. 3 illustrates an example photosensor pixel 300 having uniform cell geometry receiving an asysmmetric amount of light 302. In this example, the signal will saturate the cells in the photosensor pixel much sooner in the bottom right corner than in the remaining portions of the photosensor area, resulting in poor signal linearity. Correction for the asymmetrical amount of light received requires obtaining an optimum trade-off between detection efficiency and signal linearity. Detection efficiency increases with large photosensor cell sizes, because there is usually a minimum gap size between the sensitive parts of the cells, and more area is lost to these gaps as the cells become smaller. On the other hand, the signal linearity increases with higher cell density, because then it is less likely for photons to impinge on the same cells. The optimum trade-off between detection efficiency and signal linearity depends on the specific patterns of light detected. However regardless of the light levels detected, either detection efficiency or signal linearity will be compromised—the exact comprise depends on which trade-off will be more favorable for a particular situation.

FIGS. 4a-4d illustrate a typical detector design for PET imaging. PET detectors are often built as block detectors, where an array of scintillator crystals is coupled to an array of photosensors. In this example, there are 3×3 scintillation crystals coupled to 2×2 sensors, as most clearly seen in FIG. 4a. FIG. 4b illustrates a non-uniform light distribution for emission from the center scintillator pixel, FIG. 4c illustrates emission from an edge pixel, and FIG. 4d illustrates emission from a corner pixel. A result of these light distribution patterns is that the relevant signal range per photosensor pixel for those outer areas is higher than the signal range for the inner areas. In addition, the signal for the corner events will saturate earlier when a uniform cell density is used. While on average the outer areas do not receive more light, the light can be more concentrated on these outer areas for gamma interactions in certain scintillator crystals.

SUMMARY

In a detector block where light from a scintillator can be subsequently absorbed by a photosensor, such as a silicon photomultiplier (SiPM), the detector block can utilize photosensor pixels having a variation in cell size and density. The specific variation employed can be matched to the expected light distribution for a given scintillator coupling geometry, thus achieving a better compromise between detection efficiency and signal linearity than with a uniform cell distribution. For example, in circumstances where light is more concentrated at the edges of a photosensor, a higher cell density can be provided in the outside sensor areas. Alternatively, if the light patterns typically concentrate in the center of the photosensor array, a higher number of cells can be provided in the middle of the photosensor. Depending on the specific light variation pattern being detected, the specific pattern of cells employed in the photosensor can change.

Multiple interactions (e.g., Compton scattering and photoelectric absorption) of 511 keV gamma-rays in PET scanners results in different combinations of energy depositions. In a standard, uniform cell structure, if all the energy of a gamma photon is deposited in one scintillator crystal, the photosensor pixels close to this scintillator crystal can easily become saturated and the energy sum can be incorrectly detected. However, if the large energy deposition occurs in a scintillator crystal of a detector block that is configured to have a non-uniform cell pattern in the photosensor pixels, the likelihood of saturation can be diminished and a more accurate detection of the energy released can be determined. In this case, the non-uniform cell pattern can be configured based on an expected pattern of light distribution, or can alternatively be based on a large pattern of light distribution extending beyond a single photosensor.

Embodiments of the present disclosure include an apparatus and method for collecting light distribution of varying density, resulting in an improved detection efficiency and signal linearity. A first exemplary embodiment includes a method of manufacturing a photosensor array having detector cells of varying cell size and varying density. The method first receives a light distribution pattern associated with a particular solid-state photosensor/scintillator coupling geometry. Using this received light distribution pattern, an expected light distribution pattern is created for each photosensor pixel. Using this expected light distribution pattern, a pattern of photosensor cells is created, where the density, size, or both the density and the size of the photosensor cells varies throughout the pattern.

A second exemplary embodiment includes a solid-state photosensor array with pixels each having cells arranged in a non-uniform pattern. This non-uniform pattern is based on a modeled light distribution pattern for a given application, such as for example a particular scintillator coupling geometry, and is used to arrange multiple solid-state photosensor pixels (e.g. photodiodes), each having an array of cells according to the pattern, where the multiple cells vary in size and density. In addition, the spacing between the individual cells may vary, resulting in a non-uniform array of cells matched to an expected light distribution profile.

A third exemplary embodiment includes an apparatus employing a plurality of solid-state photosensor pixels with associated photodiode cells arranged in an array or matrix. The photodiode cells are arranged in a pattern, the cell pattern being based on a light distribution profile. The multiple photodiode cells vary in size, density, and/or the spacing between adjacent photodiode cells. Examples of an apparatus employing a solid-state photosensor include nuclear imaging detectors, such as those used for Positron Emission Tomography (PET) or Single Photon Emission Tomography (SPECT).

BRIEF DESCRIPTION OF THE DRAWINGS

FIG. 7 illustrates an example method of manufacture of a solid-state photosensor having non-uniform cell density and non-uniform cell sizes.

DETAILED DESCRIPTION

In a SiPM photosensor consisting of an array of cells, if multiple photons simultaneously impinge in one detector cell, that cell can become saturated, resulting in errors in the determination of the characteristics of the associated scintillation event. A photosensor block configured to have a non-uniform cell pattern can reduce such problems by providing a higher number of smaller cells in regions expected to receive a higher number of light photons. In this case, the non-uniform cell pattern can be generated based on a known pattern or profile of light distribution, for example in accordance with a particular scintillator-detector geometry.

Considering for example the light distribution pattern seen in FIGS. 4a-4d, on average a higher cell density in the outer regions of the block can help to reduce signal saturation in any one cell, particularly for the concentrated light at the corner regions. In addition, a lower density of larger cells near the center of the block can help to achieve a higher detection efficiency. Such a non-uniform cell configuration, applied to the scintillator-photosensor geometry of FIG. 4, is shown in FIG. 5.

Figure 1:
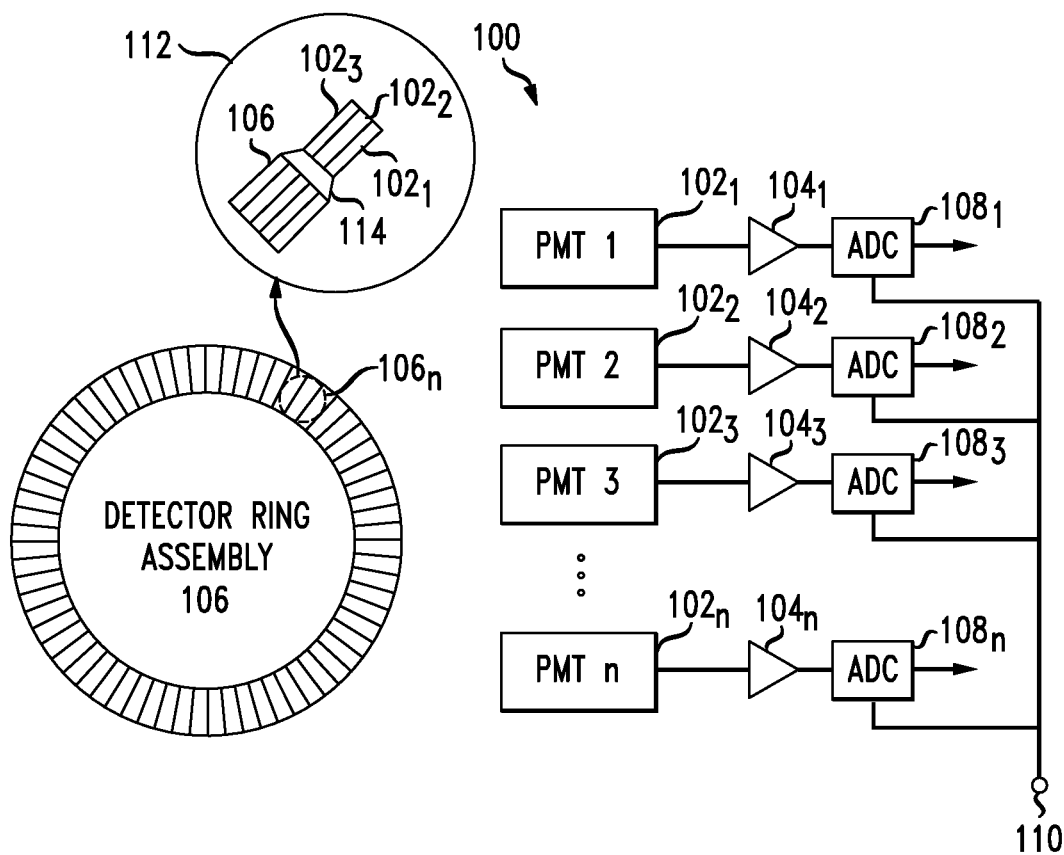
FIG. 1 illustrates a conventional detector ring assembly with associated detector circuitry of a conventional PET scanner.
Figure 2:
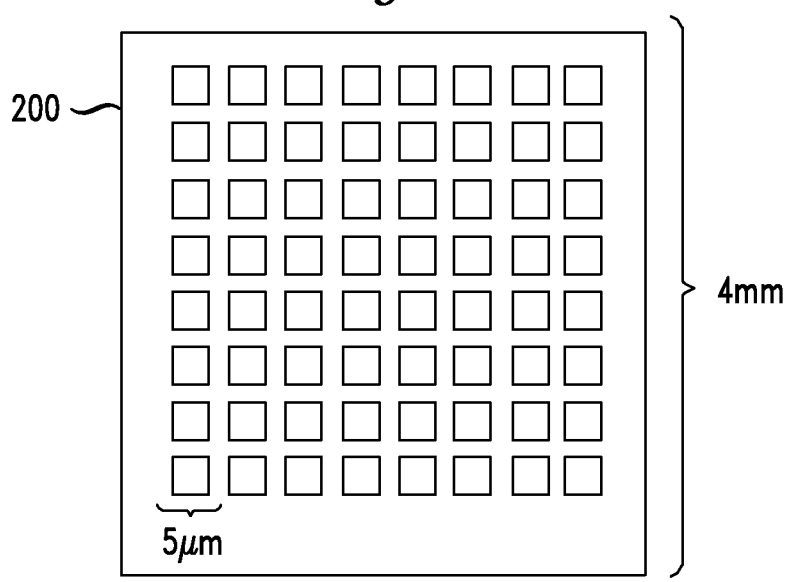
FIG. 2 illustrates a uniform n×n array of cells within one photosensor pixel.
Figure 3:
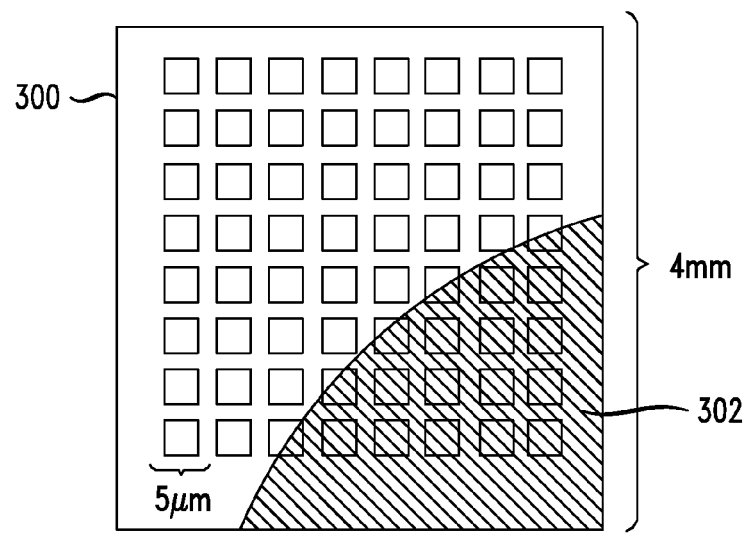
FIG. 3 illustrates a non-uniform light distribution over an array of cells within one photosensor pixel.
Figure 4:
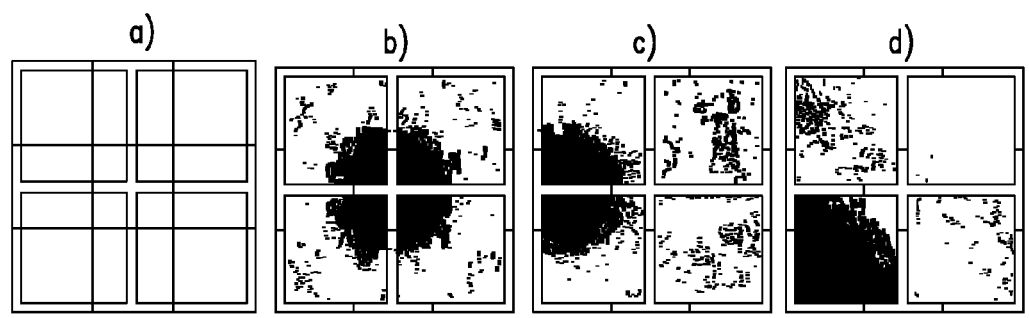
FIGS. 4a-4d illustrate examples of photosensors receiving non-uniform light distributions.
Figure 5:
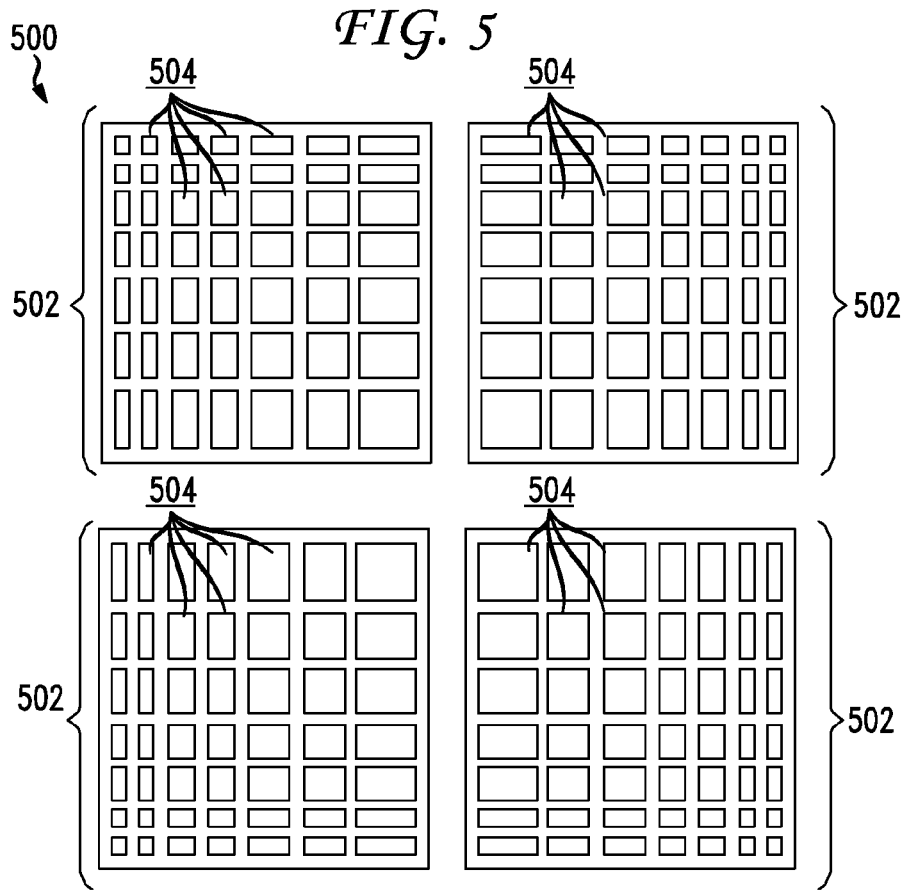
FIG. 5 illustrates an example of a 2×2 SiPM sensor array with varying cell sizes and densities according to an embodiment of the invention.

In the example of FIG. 5, cell size and density differences are exaggerated. In reality, the number of cells 504 per device 502 can be much higher in realistic designs, such as several thousand cells per device 502. One consequence of varying the cell size according to the expected signal levels is that the capacitance of the cells will vary over the area of the device 502. This is important for PET applications, because the cell capacitance has a direct influence on the pulse width, and therefore influences timing accuracy. It also presents a possible advantage, because the cell sizes can be reduced in specific areas of the sensor without sacrificing overall efficiency drastically.

On the other hand, non-uniform capacitance can lead to a spread in measured time stamps, depending on the exact light distribution received. In certain configurations of devices configured according to this disclosure, a quenching resistor is varied according to the cell size, resulting in an overall pulse width which remains constant for the varying cell types. In other configurations, a parasitic capacitance of the quench resistor or a physical capacitance is varied according to cell size, such that the signal shape is uniform for different cell sizes. In addition, the configuration seen in each photosensor in an array of photosensors need not be identical. Instead, the non-uniform configuration of cells can be determined for an area covering multiple sensors. For example, in FIG. 5, the configuration of each sensor 502 is shown as identical across the array of sensors 500, despite the sensors 502 being arranged at 90° from one another. Depending on the light distribution pattern for which this pattern of cells was developed, instead of identical patterns, each sensor 502 can have a unique pattern which best meets the demands of the light distribution pattern.

Figure 6A:
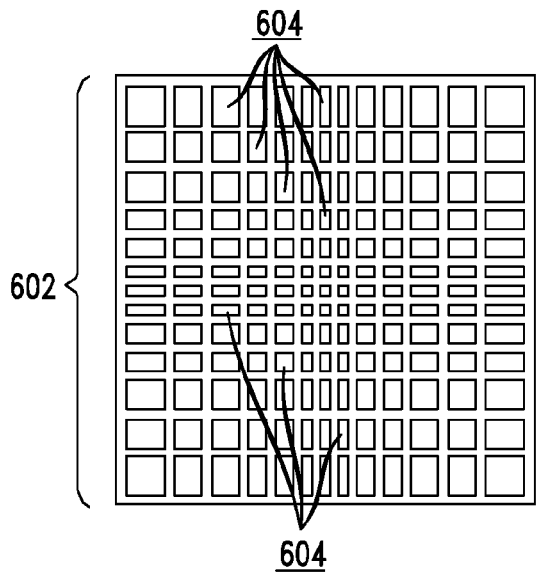
FIGS. 6a and 6b illustrate additional patterns of photosensors having varying cell sizes and densities according to another embodiment of the invention.
Figure 6B:
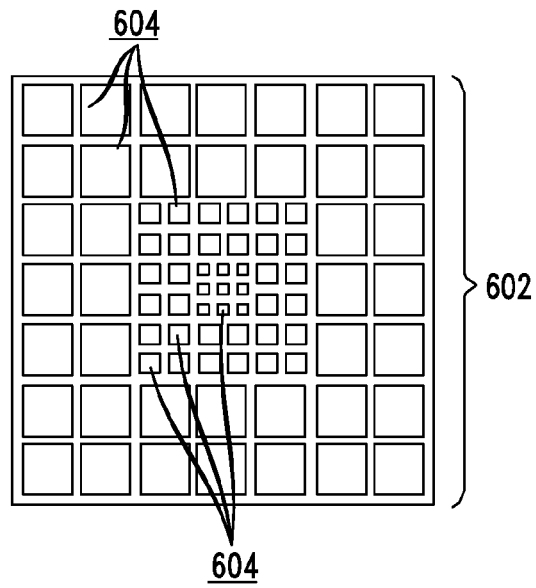

FIGS. 6a and 6b illustrate two additional examples of varied cell densities and cell sizes across photosensors. Both examples illustrate possible configurations where a light distribution pattern has indicated oversaturation in the center of the sensor 602. Other possible configurations can adjust the spacing between the cells and the angles of the cells 604 with respect to one another.

FIG. 7 illustrates an example method embodiment associated with manufacturing a device in accordance with this disclosure. In this exemplary method, a light distribution pattern associated with a particular solid-state photosensor/scintillator geometry is received (702). Using this light distribution pattern, an expected light distribution profile is determined (704). In one example, the expected light distribution profile is determined from a single received light distribution pattern. In other instances, the expected light distribution profile is refined by being based on multiple light distribution patterns received over a period of time. Consider the example light distribution pattern of FIGS. 4b-4d. If an expected pattern were determined after looking at only a single one of those light distribution patterns, the resulting pattern might have been less efficient than the original. Instead, compiling the information of many possible distribution patterns can lead to better estimates of expected light distribution, and a better expected light distribution profile.

Having determined the expected light distribution profile, an array pattern of photodiode cells is created, wherein the pattern of photodiode cells in the array has at least one of a varying photodiode cell size and a varying photodiode cell density (706). The pattern of photodiode cells can be a map describing where each individual cell will be placed. Other factors which can be taken into account are a variance in spacing between cells, the types of crystals being used, etc. Having developed the pattern of photodiode cells, an adapted solid-state photosensor can be manufactured using the pattern of photodiode cells (708). In certain configurations, this adapted photosensor can be a silicon photomultiplier (SiPM) photosensor.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. For example, while the disclosure focuses on PET applications, a person of ordinary skill in the art could, after reviewing this disclosure, apply the same principles to gamma cameras for SPECT and planar imaging because the systems operate in a similar manner. Other applications include low-dose CT, photon-counting CT, planar imaging, high-energy physics experiments, X-ray fluorescence and range-finding measurements. The depicted and described embodiments of this disclosure are examples only, and are not exhaustive of the scope of the disclosure.

What is claimed is:

1. A solid-state photosensor comprising:
    an array of sensor cells arranged in a pattern, wherein:
        the pattern is associated with a predeteiwined light distribution profile, wherein
        the plurality of sensor cells vary in at least one of size, density, and spacing between cells so as to minimize signal saturation of any one cell and;
        a plurality of quenching resistors, wherein each quenching resistor in the plurality of quenching resistors is associated with a sensor cell in the plurality of sensor cells.

2. The solid-state photosensor of claim 1, wherein the solid-state photosensor comprises a silicon photomultiplier (SiPM).

3. The solid state photosensor of claim 2, wherein said SiPM is configured as a 2×2 block, and each sensor in the block has an identical cell pattern.

4. The PET imaging apparatus of claim 3, wherein said SiPM is configured as a 2×2 block, and each sensor in the block has an identical cell pattern.

5. The solid state photosensor of claim 1, wherein the solid-state photosensor comprises an avalanche photodiode (APD) sensor.

6. The solid state photosensor of claim 5, wherein adjacent sensors in the block are oriented at a 90 degree angle with respect to each other.

7. The solid state photosensor of claim 1, where each quenching resistor is varied according to cell size.

8. The solid state photosensor of claim 1, where each quenching resistor has a parasitic capacitance which is varied according to cell size.

9. The solid state photosensor of claim 1, where each cell has an additional physical capacitance which is varied according to cell size.

10. The PET imaging apparatus of claim 9, wherein said plurality of solid-state photosensors comprise silicon photomultipliers (SiPM).

11. The PET imaging apparatus of claim 9, wherein said plurality of solid-state photosensors comprise avalanche photodiode (APD) sensors.

12. The PET imaging apparatus of claim 9, wherein cells at a center portion of said array are larger than cells at outer portions of said array.

13. The PET imaging apparatus of claim 9, wherein at least one cell of said array is rectangular, and least one other cell of said array is square.

14. The solid state photosensor of claim 1, wherein cells at a center portion of said array are larger than cells at outer portions of said array.

15. The solid state photosensor of claim 1, wherein at least one cell of said array is rectangular, and least one other cell of said array is square.

16. The PET imaging apparatus of claim 15, wherein adjacent sensors in the block are oriented at a 90 degree angle with respect to each other.

17. A PET imaging apparatus comprising:
a PET detector assembly including a plurality of solid-state photosensors, wherein at least one of said plurality of photosensors comprises an array of sensor cells arranged in a pattern, wherein:
the pattern is associated with a predetermined light distribution profile, wherein
the plurality of sensor cells vary in at least one of size, density, and spacing between cells so as to minimize signal saturation of any one cell and;
a plurality of quenching resistors, wherein each quenching resistor in the plurality of quenching resistors is associated with a sensor cell in the plurality of sensor cells.

18. The PET imaging apparatus of claim 17, where each quenching resistor is varied according to cell size.

19. The PET imaging apparatus of claim 17, where each quenching resistor has a parasitic capacitance which is varied according to cell size.

20. The PET imaging apparatus of claim 17, where each cell has an additional physical capacitance which is varied according to cell size.

21. A solid-state photosensor comprising:
an array of sensor cells arranged in a non-uniform pattern, wherein:
the pattern is configured based on a predetermined non-uniform light distribution profile wherein
the array of sensor cells vary in at least one of size, density, and spacing between cells so as to minimize signal saturation of any one cell and
a plurality of quenching resistors, wherein each quenching resistor in the plurality of quenching resistors is associated with a sensor cell in the array of sensor cells.

* * * * *

UNITED STATES PATENT AND TRADEMARK OFFICE
CERTIFICATE OF CORRECTION

PATENT NO.         : 8,791,514 B2                                       Page 1 of 1
APPLICATION NO.    : 13/540079
DATED              : July 29, 2014
INVENTOR(S)        : Debora Henseler, Ronald Grazioso and Nan Zhang It is certified that error appears in the above-identified patent and that said Letters Patent is hereby corrected as shown below:

In the Claims

Column 6, Claim 1, Line 47, "predeteiwined" should read -- predetermined --

Signed and Sealed this
Fourteenth Day of October, 2014

Michelle K. Lee
*Deputy Director of the United States Patent and Trademark Office*